US010398057B1

United States Patent
Alvarez

(10) Patent No.: US 10,398,057 B1
(45) Date of Patent: Aug. 27, 2019

(54) SIGNAL TRANSMISSION SYSTEM

(71) Applicant: Reichle & De-Massari AG, Wetzikon (CH)

(72) Inventor: Bryce K. Alvarez, Milpitas, CA (US)

(73) Assignee: Reichle & De-Massari AG, Wetzikon (CH)

(*) Notice: Subject to any disclaimer, the term of this patent is extended or adjusted under 35 U.S.C. 154(b) by 0 days.

(21) Appl. No.: 15/951,245

(22) Filed: Apr. 12, 2018

(51) Int. Cl.
| H05K 5/00 | (2006.01) |
| H05K 7/00 | (2006.01) |
| H05K 7/18 | (2006.01) |
| H05K 5/02 | (2006.01) |
| H04Q 1/04 | (2006.01) |

(52) U.S. Cl.
CPC ........... *H05K 7/186* (2013.01); *H05K 5/0204* (2013.01); *H04Q 1/04* (2013.01)

(58) Field of Classification Search
CPC ........................................................ G06F 1/16
See application file for complete search history.

(56) References Cited

U.S. PATENT DOCUMENTS

| 857,543 A | 6/1907 | Thomas |
| 3,697,034 A | 10/1972 | Shell |
| 5,538,213 A | 7/1996 | Brown |
| 6,109,461 A | 8/2000 | Kluge et al. |
| 6,402,106 B1 | 6/2002 | Padiak |
| 6,978,975 B1 | 12/2005 | Magnusson |
| 7,140,500 B2 | 11/2006 | McCoy |
| 7,392,911 B2 | 7/2008 | Stitchick et al. |
| 9,173,506 B2 | 11/2015 | Andersson et al. |
| 2006/0226317 A1 | 10/2006 | Smith, Jr. |
| 2007/0221597 A1 | 9/2007 | Chen |
| 2008/0237156 A1* | 10/2008 | Cheng-Yuan ........ G11B 33/127 211/26 |
| 2015/0027972 A1 | 1/2015 | Andersson et al. |

* cited by examiner

Primary Examiner — Jerry Wu
(74) Attorney, Agent, or Firm — Posz Law Group, PLC

(57) ABSTRACT

A fixing system, in particular a signal transmission fixing system, includes at least one fixing unit, at least one mounting element for holding the fixing unit, the mounting element having at least one reception region for the reception of at least one part of the fixing unit, the mounting element fixing the fixing unit in at least one first direction and in at least one second direction being oriented at least substantially antiparallel to the first direction.

18 Claims, 5 Drawing Sheets

SIGNAL TRANSMISSION SYSTEM

PRIOR ART

Figure 1:
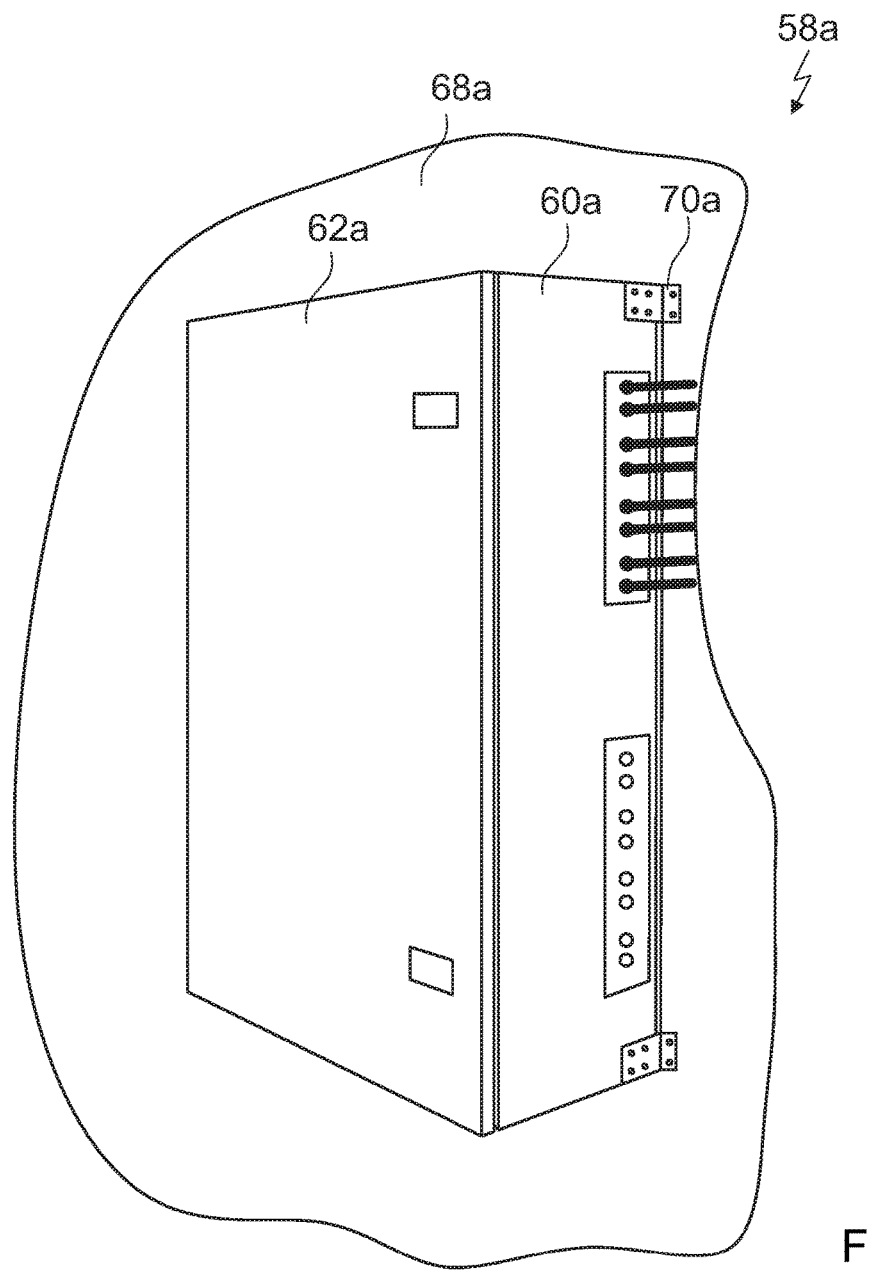

The invention relates to a fixing system, in particular to an optical data transmission system and to a telecommunication enclosure having at least one fixing system.

From the prior art a fixing system is already known comprising a fixing unit and a mounting element for holding the fixing unit. The mounting element is embodied as a mounting plate and has a main extension plane which is oriented perpendicularly to a base in a mounted state. The mounting element has a reception region for the reception of a part of the fixing unit. In the mounted state, the mounting element fixes the fixing unit in a first direction, which is oriented parallel to a gravitational force and which is directed towards the base. In case of a force, acting from below the fixing unit, for example in case that a user touches the fixing unit from below, the fixing unit can be disengaged from the reception region.

The objective of the invention is, in particular, to provide a fixing system with improved characteristics regarding a fixation, in particular of a fixing unit to a mounting element. The objective is achieved, according to the invention, while advantageous implementations and further developments of the invention may be gathered from the dependent claims.

Advantages of the Invention

A fixing system, in particular signal transmission fixing system, is proposed comprising: at least one fixing unit, in particular at least one equipment fixing unit, at least one mounting element for holding the fixing unit, the mounting element having at least one reception region for the reception of at least one part of the fixing unit, the mounting element fixing the fixing unit in at least one first direction and in at least one second direction being oriented at least substantially antiparallel to the first direction.

By means of the invention in particular an optimized fixation, in particular an optimized fixation of a fixing unit to a mounting element, can be achieved. In particular, a high stability can be achieved. It can in particular be prevented that the fixing unit disengages from the reception region in case the fixing unit is accidentally touched, in particular by a user and/or by a technician.

A "fixing system" is in particular to be understood as a system configured for fixing at least one fixing unit to at least one mounting element. The fixing system may in particular be embodied as a mobile fixing system, which may in particular be used in at least one mobile appliance. The mobile appliance may in particular be a boat and/or an aircraft and/or a vehicle, in particular a truck, and/or an ambulance and/or a motor home. The fixing unit may in particular fix at least one mobile appliance equipment to the mounting element. Alternatively and/or additionally, the fixing system may in particular be embodied as a household fixing system and/or as a home fixing system. For example the fixing system, in particular the household fixing system and/or as a home fixing system, may in particular be used in at least one household and/or in at least one apartment house. The fixing unit may in particular fix at least one household equipment to the mounting element. In particular, the household equipment may in particular be embodied as a shelf and/or as cubicle furniture.

Preferably, the fixing system is embodied as a signal transmission fixing system. The fixing unit is preferably embodied as an equipment fixing unit and in particular configured for fixing at least one signal transmission equipment to the mounting element. A "signal transmission system" is in particular to be understood as a system configured for transmission of at least one signal in particular in an electrical and/or in an optical fashion. For example in case of an optical transmission of the signal, the signal transmission system may in particular transmit the signal via electromagnetic radiation.

A "fixing unit" may in particular be understood as a unit which, in at least one mounted state, fixes at least one equipment, in particular at least one signal transmission equipment, to the mounting element. In at least one mounted state, the fixing unit in particular connects the equipment and the mounting element. The fixing unit is, in at least one mounted state, in particular located between the equipment and the mounting element, at least to a large part. The term "at least to a large part" is in particular to be understood as an amount, in particular as an amount of mass and/or of volume, of at least 70%, in particular of at least 80%, advantageously of at least 90% and particularly advantageously of at least 95%.

The fixing system may in particular comprise the equipment, which may in particular be embodied as signal transmission equipment. For example, the equipment may in particular comprise at least one plug and/or at least one connector and/or at least one cable and/or at least one electrical device and/or at least one electronical device and/or at least one optical device.

A "mounting element" may in particular be understood as an element which, in at least one mounted state, in particular holds at least the fixing unit and preferably at least one equipment attached to the fixing unit and which, in at least one mounted state, in particular absorbs the gravitational force at least of the fixing unit, and in particular of the equipment, and which, in at least one mounted state, in particular transfers the absorbed gravitational force to at least one further object. The further object may in particular be a wall in particular of a house and/or of a room and/or of a mobile appliance and/or of a furniture and/or of a telecommunication enclosure. The fixing system in particular comprises the further object. In at least one mounted state, the mounting element is in particular connected to and preferably fixed to the further object.

In a mounted state, in which in particular the fixing unit is fixed to the mounting element and in which in particular a signal transmission equipment is fixed to the mounting element by means of the fixing unit, the signal fixing equipment can in particular be fixed in any direction to the mounting element, while in particular remaining secure against forces in any direction.

A "reception region" is in particular to be understood as a hole and/or as a recess and/or as an opening and/or a groove, in which at least one part of the fixing unit projects into and/or projects through, in at least one mounted state. In at least one mounted state, at least one part of the fixing unit is located inside the reception region. In particular, at least one part of the fixing unit projects into the reception region and/or projects through the reception region, in at least one mounted state. In particular, in at least one mounted state, at least one first part of the fixing unit is located on a first side of the mounting element and at least one second part of the fixing unit, which differs from the first part of the fixing unit, is located on a second side of the mounting element, which differs from the first side of the mounting element.

In particular, the first direction and the second direction are oriented substantially parallel, while facing in opposite directions and/or being oriented in opposite directions. The term "substantially parallel" is in particular to mean an orientation of a direction relative to a reference direction, in particular in a plane, wherein the direction differs from the reference direction in particular by maximally 8°, advantageously maximally 5°, particularly advantageously maximally 3°, preferably maximally 2° and particularly preferably maximally 1°. In at least one mounted state, for example the first direction may be oriented facing towards a base and the second direction may be oriented facing away from the base. Alternatively, the first direction may in particular be oriented facing away from a base and the second direction may be oriented facing towards the base.

The fixing unit and/or the mounting element may in particular be embodied at least to a large part from plastic and/or metal. For example, the fixing unit and/or the mounting element may in particular be embodied at least to a large part from steel and/or cold rolled steel and/or zinc. In particular, the fixing unit and/or the mounting element may in particular be coated and/or painted, for example for optimizing a stress resistance. The fixing unit and/or the mounting element may in particular be made with, in particular industry standard, sheet metal fabrication methods, thereby in particular an easy fabrication can be achieved and/or the usage of special materials can in particular be omitted.

Preferably, the fixing unit and/or the mounting element may in particular be made in one piece, thereby an assembly process can in particular be omitted. Alternatively, the fixing unit/or the mounting element may in particular be embodied in at least two, in particular of at least three piece, which may in particular be connected and preferably fixed to each other, in at least one mounted state.

In this context, "configured" is in particular to mean specifically programmed, designed and/or equipped. By an object being configured for a certain function is in particular to be understood that the object implements and/or fulfills said certain function in at least one application state and/or operating state.

Furthermore, it is proposed that the reception region has at least one insertion region for the insertion of the part of the fixing unit and at least one holding region for holding the part of the fixing unit in at least one mounted state. In particular, the insertion region and the holding region differ from each other and are in particular two different parts of the reception region. The insertion region and the holding region are preferably connected to each other, in particular in such a way that the part of the fixing unit can in particular be moved from the insertion region to the holding region and/or from the holding region to the insertion region. In particular for fixing the fixing unit to the mounting element, the part of the fixing unit is inserted and/or engaged into the insertion region. The part of the fixing unit is, in particular after the insertion and/or engagement into the insertion region, transferred from the insertion region to the holding region. In at least one mounted state, in which the fixing unit is in particular fixed to the mounting element, the part of the fixing unit is in particular located in the holding region. By means of this in particular a high stability and/or a high safety can in particular be achieved.

In addition, it is proposed that the mounting element being embodied as a mounting plate. The mounting element has, in at least one mounted state, in particular a main extension plane which is oriented at least substantially perpendicular to the base. The mounting element in particular has a thickness which is much smaller than a width and a length of the mounting element. In particular, the width and a length of the mounting element are at least five times, in particular at least seven times, preferably at least ten times and advantageously at least fifteen times greater than the thickness of the mounting element. By a "main extension plane" of an object in particular a plane is to be understood which is oriented parallel to a largest side of a smallest imaginary rectangular cuboid just still entirely enclosing the object, and which in particular extends through a center point of the rectangular cuboid. The term "substantially perpendicular" is in particular to mean an orientation of a direction relative to a reference direction, the direction and the reference direction including, in particular in one plane, an angle of 90° and the angle having a maximum deviation of, in particular, maximally 8°, advantageously maximally 5° and particularly advantageously maximally 3°, preferably maximally 5° and particularly preferably maximally 1°. On account on this, in particular a compact embodiment can in particular be achieved.

For example, the mounting element may in particular constitute a wall, in particular a house wall and/or a wall of a mobile appliance and/or a wall of a furniture. Preferably, the mounting element constitutes a back wall of at least one cabinet, in particular of at least one electrical and/or electronical device. By means of this in particular a low number of components can in particular be achieved. An additional element and/or component can in particular be omitted, thereby in particular saving costs and/or money.

The insertion region may in particular be embodied as a hole and/or as a recess and/or as an opening, in particular of the mounting element. Preferably, the insertion region is embodied as a groove. On account on this, a compact embodiment can in particular be achieved. In particular, the part can in particular be inserted into an easy manner.

Furthermore, it is proposed that the insertion region and the holding region being located next to each other with respect to at least one longitudinal extension direction of the reception region. A "longitudinal extension direction" of an object is in particular to mean a direction which is oriented parallel to a largest side of a smallest imaginary rectangular cuboid which just still entirely encloses the object. A longitudinal extension direction of the insertion region and a longitudinal extension direction of the holding region are in particular oriented at least substantially parallel to each other. The insertion region and the holding region are, in at least one mounted state, in particular located next to each other in a direction, which is oriented in particular at least substantially perpendicular to the longitudinal extension direction of the reception region and in particular at least substantially parallel to a main extension plane of the mounting element. By means of this, a high stability can in particular be achieved. In particular, the part of the fixing unit can in particular be fixed simultaneously in the first direction and in the second direction.

Additionally, it is proposed that the insertion region has a greater extension in at least one longitudinal extension direction of the reception region than the holding region. In particular, a longitudinal extension of the insertion region is at least 110%, in particular at least 120%, advantageously at least 130%, particularly advantageously at least 140%, preferably at least 150% and particularly preferably at least 160% of a longitudinal extension of the holding region. An "extension" of an object is in particular to mean a maximum distance between two points of a perpendicular projection of the object onto a plane. A "longitudinal extension" of an object is in particular to be understood as an extension of the object in a longitudinal extension direction of the object. By means of this, the fixation unit can in particular be fixed to the mounting element in a stable fashion.

The insertion region may in particular project, in the longitudinal extension direction of the reception region, beyond the holding region on one, in particular on exactly one side. Preferably, the insertion region projects, in the longitudinal extension direction of the reception region, beyond the holding region on both sides. On account on this, an easy manufacturing of the mounting element and/or a high symmetry can in particular be achieved.

Furthermore, it is proposed that the insertion region comprises at least one insertion sub-region having at least one longitudinal extension direction which is orientated inclined with respect to at least one longitudinal extension direction of the holding region. The wording, that a first direction is orientated "inclined" with respect to a second direction, is in particular to be understood, that the first direction and the second direction enclose a minimal angle of at least 1°, in particular of at least 3°, advantageously of at least 5°, particularly advantageously of at least 7°, preferably of at least 10° and particularly preferably of at least 15° and/or of at most 89°, in particular of at most 87°, advantageously of at most 85°, particularly advantageously of at most 83°, preferably of at most 80° and particularly preferably of at most 75°, in particular in at least one perpendicular view to at least one main extension plane of the mounting element. By means of this, an easy insertion of the part of the fixation unit in the insertion sub-region can in particular be achieved, in particular as the part of the fixation unit is deflected for insertion in the insertion sub-region.

For example, the insertion region may in particular comprise exactly one insertion sub-region and in particular only the insertion sub-region. Preferably, the insertion region comprises at least one further insertion sub-region, which is connected to the insertion sub-region and which, in at least one perpendicular view to at least one main extension plane of the mounting element, encloses with the insertion sub-region an internal angle of at most 175°, in particular of at most 173°, advantageously of at most 170°, particularly advantageously of at most 168°, preferably of at most 166° and particularly preferably of at most 165°. On account on this, a high flexibility can in particular be achieved, in particular as the part of the fixing unit can be inserted into two opposing direction in the insertion region.

In addition, it is proposed that the reception region is symmetrical with respect to at least one symmetry plane which is oriented perpendicularly to at least one longitudinal extension direction of the reception region and which in particular passes through a center point and/or through a midpoint of the reception region, in particular in at least one perpendicular view to at least one main extension plane of the mounting element. By means of this, an easy manufacturing of the mounting element and/or a high degree of symmetry can in particular be achieved.

Furthermore, it is proposed that the mounting element comprising at least one further reception region which has at least one further insertion region and at least one further holding region, wherein the insertion region and the further insertion region are located next to each other in at least one direction, which is in particular oriented at least substantially perpendicular and/or at least substantially parallel to at least one longitudinal extension direction of the reception region. In particular, at least two, in particular at least four, advantageously at least six, particularly advantageously at least eight, preferably at least ten and particularly preferably at least twelve further reception regions, each of which in particular having at least one further insertion region and at least one further holding region. The insertion region and at least one of the further insertion regions are in particular located next to each other in at least one direction. Preferably, the insertion region and at least a large part of the further insertion regions are arranged in a matrix pattern. On account on this, a high flexibility can in particular be achieved, in particular as the fixing unit can be fixed to the mounting element in at least two different positions.

The insertion region and the further insertion region, in particular at least a large part of the further insertion regions, may in particular be located in a row. Preferably, the mounting element comprises a plurality of further reception regions which are arranged in a matrix-like pattern. By means of this, the fixation unit can in particular be fixed to the mounting element in a plurality of positions, thereby in particular a high flexibility can be achieved. By means of the matrix-like pattern, the further reception regions which are arranged in, a high degree of symmetry and/or clear arrangement can in particular be achieved, thereby in particular an easy reparation can in particular be achieved. In particular, the matrix-like pattern allows a cable technician to place the fixing unit in many locations allowing for flexibility of configuration and/or layout and/or routing of cables.

Additionally, it is proposed that the fixing unit comprises at least one engagement element which constitutes the part and which is inserted into the reception region in the mounted state. In at least one mounted state, the engagement element and at least one further part of the fixing unit, in particular at least one basic body of the fixing unit, are in particular located on opposing sides of the mounting element. On account on this, the fixing unit can be fixed to the mounting element in an easy and/or uncomplicated manner.

Moreover, it is proposed that the fixing unit comprises at least one basic body, the engagement element being movable with respect to the basic body. A "basic body" of an object is in particular to be understood as an element, defining and/or embodying an amount of at least 50%, in particular of at least 60%, advantageously of at least 70%, particularly advantageously of at least 75%, preferably of at least 80% and particularly preferably of at least 85% of a total mass and/or of a total volume of the object. By means of this, a high degree of freedom of the engagement element can be achieved, thereby the fixing unit can in particular be fixed to the mounting element in a stable manner.

Furthermore, it is proposed that the engagement element comprises at least one longitudinal extension which is greater than at least one longitudinal extension of the holding region. In at least one mounted state, the fixing unit in particular at least partly and preferably by means of the engagement element, engages behind the mounting element. On account on this, a stable fixation of the fixation unit to the mounting element can be achieved.

In addition, it is proposed that the fixing unit comprises at least one connection element which connects the basic body and the engagement element in particular mechanically and which moves the engagement element back into at least one resting position after the engagement element has been moved into at least one deflection position. In particular, the connection element is located between the basic body and the engagement element at least to a large part. The engagement element is in particular at least partly elastic. By means of this, a manual moving of the engagement element back into at the resting position after the engagement element has been moved into the deflection position can be omitted, thereby in particular a high comfort and/or convenience for a user can be achieved.

The fixing system may in particular comprise at least one mobile appliance equipment and/or at least one household equipment. Preferably, the fixing system further comprises in particular at least one signal transmission equipment, the fixing unit is mounted to the mounting element in at least one mounted state and fixes the signal transmission equipment to the mounting element. In a mounted state, in which the signal transmission equipment is in particular fixed to the mounting element by means of the fixing unit, the signal transmission equipment in particular prevents a solving of the fixing unit from the mounting element. In particular, the signal transmission equipment blocks a movement of the engagement element of the fixing unit, in particular of the engagement elements of the fixing unit, in a mounted state, in which the signal transmission equipment is in particular fixed to the mounting element by means of the fixing unit. In a mounted state, in which the signal transmission equipment is in particular fixed to the mounting element by means of the fixing unit, the signal transmission equipment in particular holds and/or presses the engagement element of the fixing unit into the holding region.

On account on this, signal transmission equipment can be fixed to the mounting element in an easy and/or uncomplicated and/or safe and/or stable manner.

An optimized fixation, in particular of the fixing unit to the mounting element, can in particular be achieved by means of a telecommunication enclosure having at least one fixing system, in particular at least one signal transmission system.

Herein the fixing system, in particular signal transmission fixing system, is not to be limited to the application and implementation described above. In particular, for the purpose of fulfilling a functionality herein described, the fixing system, in particular signal transmission fixing system, may comprise a number of respective elements, structural components and units that differs from the number mentioned herein. Furthermore, regarding the value ranges mentioned in this disclosure, values within the limits mentioned are to be understood to be also disclosed and to be used as applicable.

DRAWINGS

Further advantages may become apparent from the following description of the drawings. In the drawings exemplary embodiments of the invention are shown. The drawings, the description and the claims contain a plurality of features in combination. The person having ordinary skill in the art will purposefully also consider the features separately and will find further expedient combinations.

If there is more than one specimen of a certain object, only one of these is given a reference numeral in the figures and in the description. The description of this specimen may be correspondingly transferred to the other specimens of the object.

Figure 2:
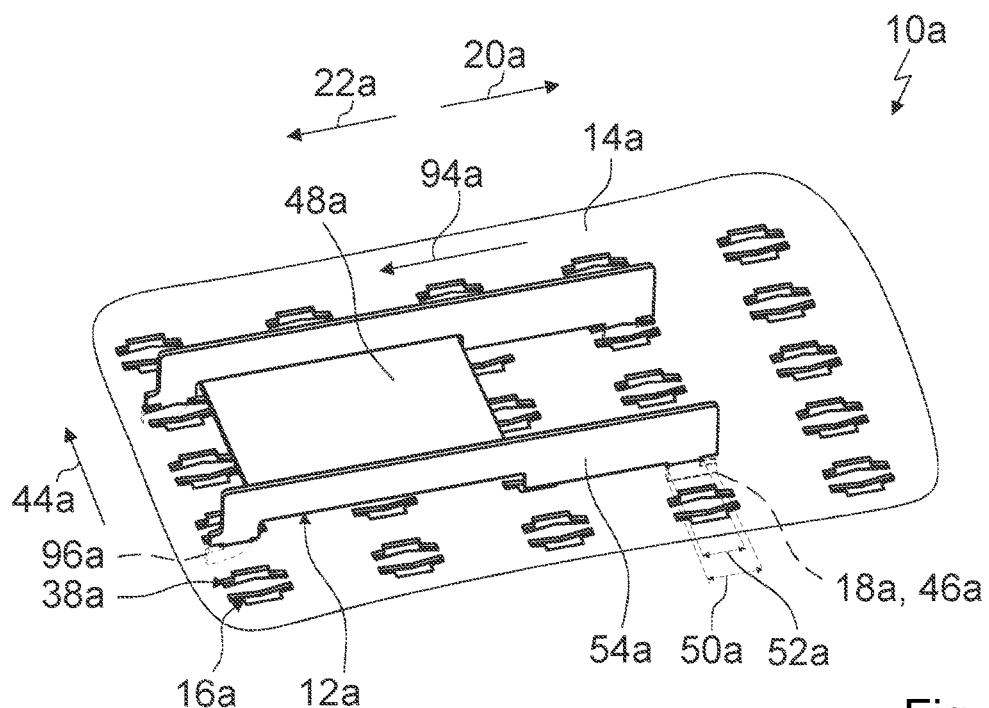
Figure 3:
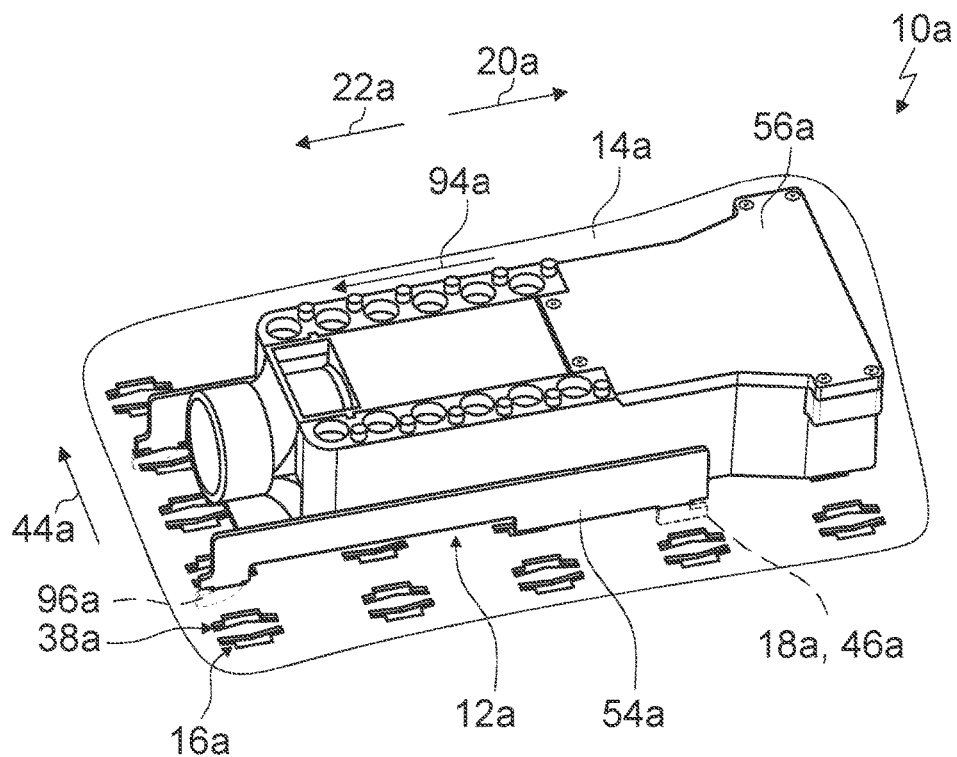
Figure 4:
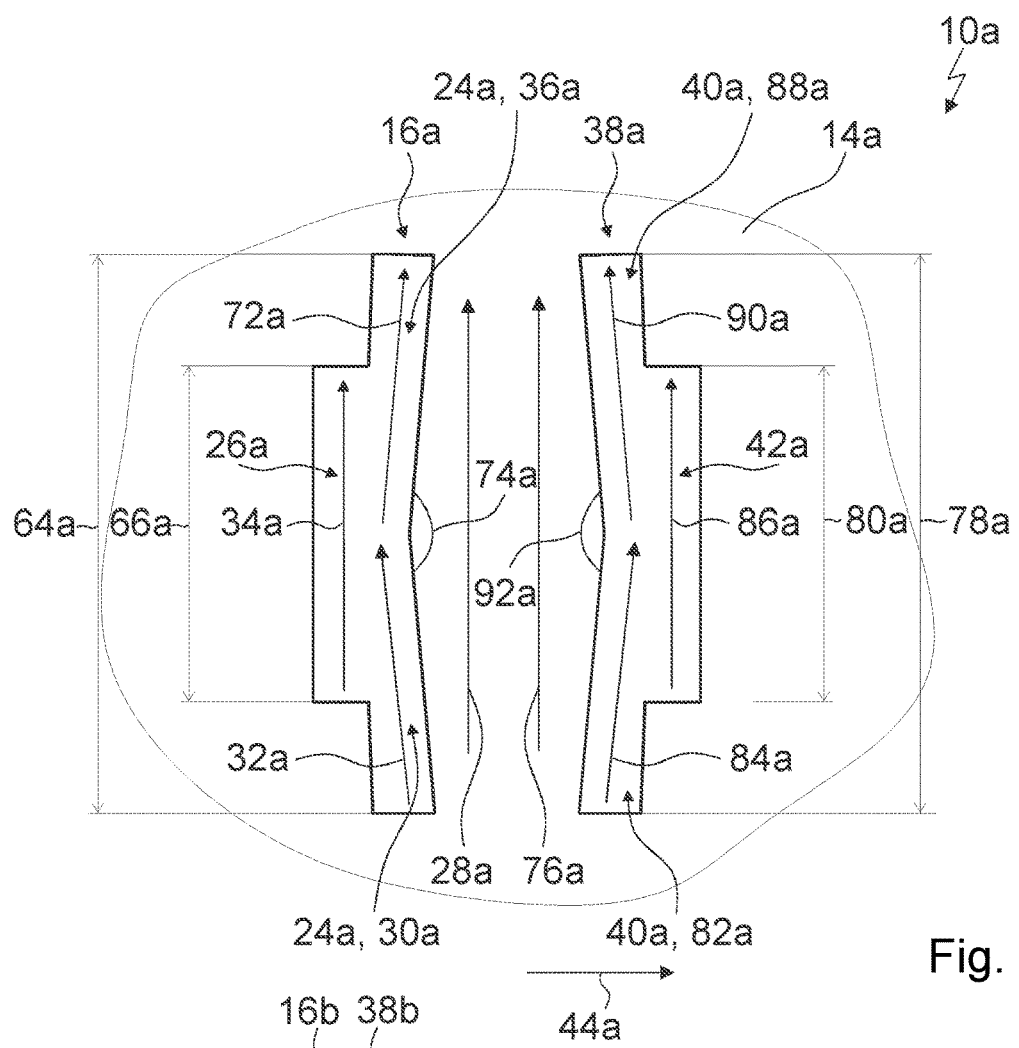
Figure 5:
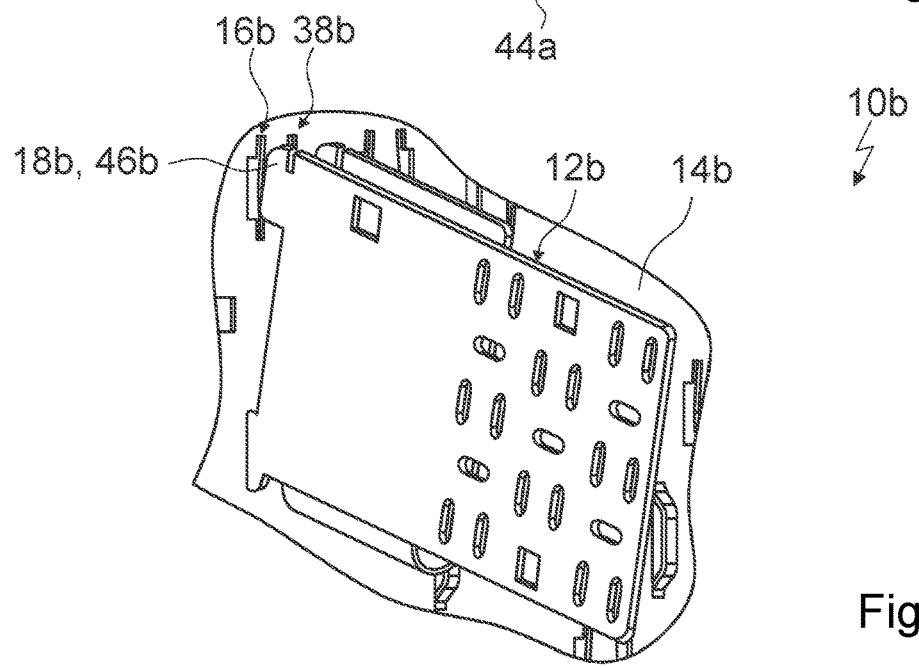
Figure 6:
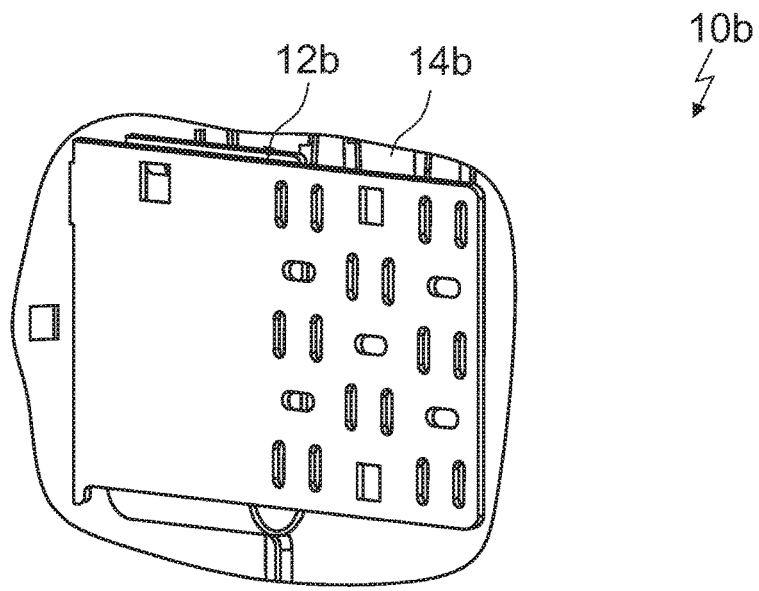
Figure 7:
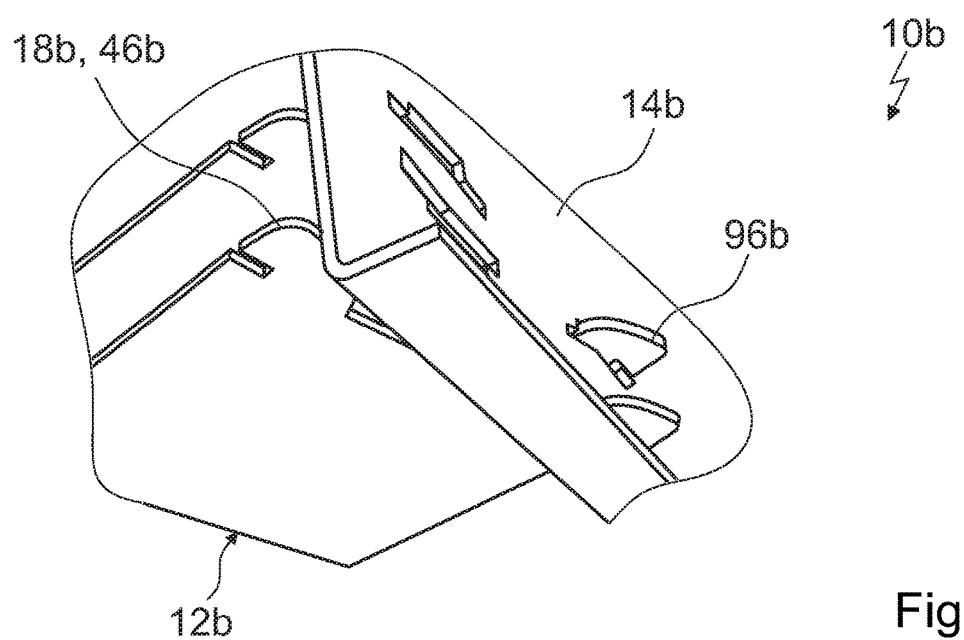
Figure 8:
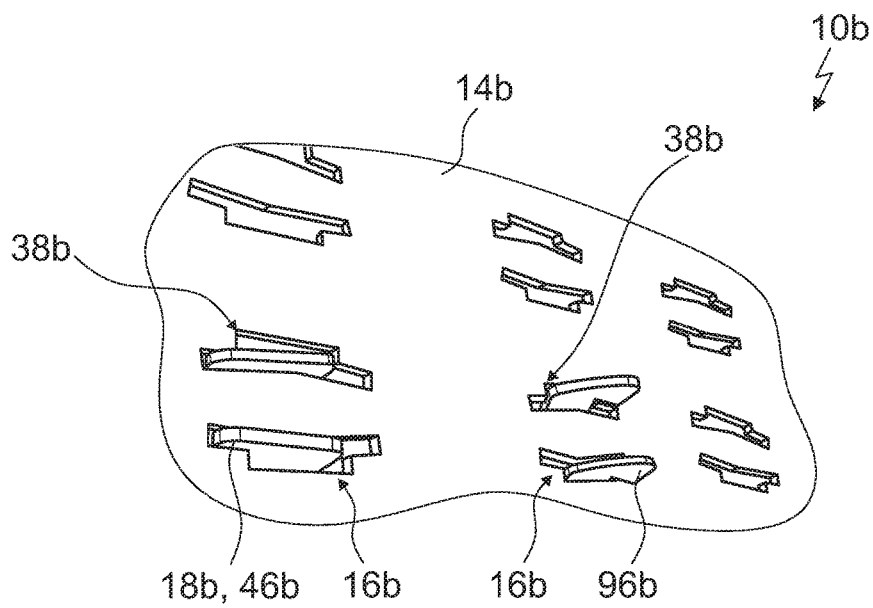
Figure 9:
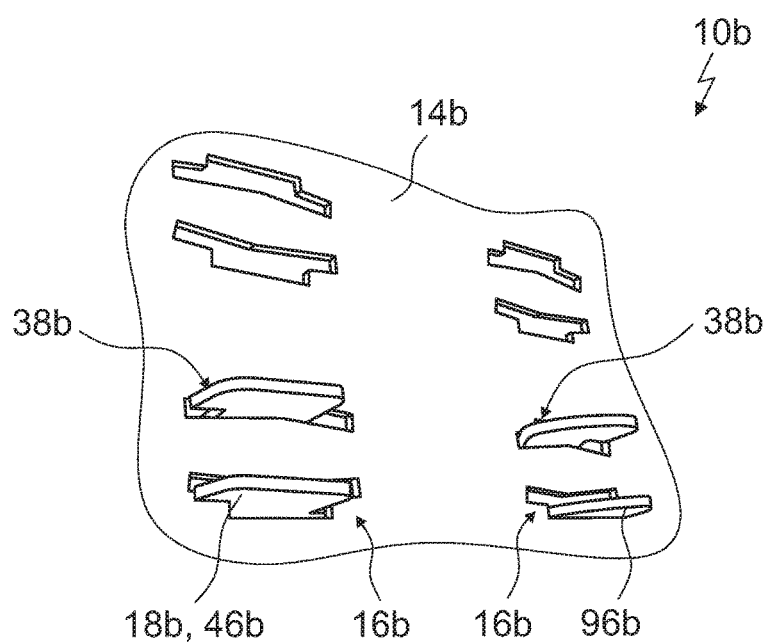

It is shown in:

FIG. 1 a telecommunication enclosure having a fixing system in a schematic view, FIG. 2 the fixing system comprising a mounting element and a fixing unit in a mounted state in a schematic view, FIG. 3 the mounting element, the fixing unit and a signal transmission equipment of the fixing system in a mounted state in a schematic view, FIG. 4 an enhanced excerpt of the mounting element in a schematic view, FIG. 5 an excerpt of an alternative fixing system in a tilted arrangement of a fixing unit of the fixing system relative to a mounting element of the fixing system when viewing from a front side in a schematic view, FIG. 6 an excerpt of the fixing system of FIG. 5 in a mounted state of the fixing unit relative to the mounting element when viewing from a front side in a schematic view, FIG. 7 an excerpt of the fixing system of FIG. 5 in a tilted arrangement of the fixing unit relative to the mounting element when viewing from a side in a schematic view, FIG. 8 an excerpt of the fixing system of FIG. 5 in a tilted arrangement of the fixing unit relative to the mounting element when viewing from a back side in a schematic view and FIG. 9 an excerpt of the fixing system of FIG. 5 in a mounted state of the fixing unit relative to the mounting element when viewing from a back side in a schematic view.

DESCRIPTION OF THE EMBODIMENTS

FIG. 1 shows a telecommunication enclosure 58a having a fixing system 10a. The fixing system 10a is embodied as a signal transmission fixing system. The telecommunication enclosure 58a has the signal transmission fixing system. In the present embodiment, the telecommunication enclosure 58a comprises a cabinet. The telecommunication enclosure 58a is ashlar-formed.

The telecommunication enclosure 58a comprises an enclosure housing 60a. The housing 60a of the telecommunication enclosure 58a defines partly an interior space. The telecommunication enclosure 58a comprises an enclosure door 62a. The enclosure door 62a defines partly the interior space. The enclosure housing 60a and the enclosure door 62a define the interior space to a large part. The enclosure door 62a is configured for opening and/or closing the interior space.

The enclosure housing 60a defines a portion of the fixing system 10a. The fixing system 10a comprises a mounting element 14a (compare FIGS. 2 to 4). The mounting element 14a constitutes a back wall of the cabinet of the telecommunication enclosure 58a. The mounting element 14a is part of the enclosure housing 60a.

The telecommunication enclosure 58a is configured for being mounted to a wall 68a, in particular to a room wall. The enclosure housing 60a configured for being mounted to the wall 68a, in particular to the room wall. In a mounted state, the enclosure housing 60a is mounted to the wall 68a, in particular by means of angle brackets 70a. The enclosure housing 60a is arranged distanced to the wall 68a, in a mounted state. The angle brackets 70a define a distance between the enclosure housing 60a and the wall 68a, in a mounted state.

In the present embodiment, the mounting element 14a is embodied as a mounting plate. The mounting element 14a has a rectangular shape. The mounting element 14a has a plate-like shape.

The fixing system 10a comprises a fixing unit 12a. The fixing unit 12a is fixed to the mounting element 14a in a mounted state. The mounting element 14a is configured for holding the fixing unit 12a. In a mounted state, the mounting element 14a holds the fixing unit 12a.

In a mounted state, the mounting element 14a fixes the fixing unit 12a in a first direction 20a and in a second direction 22a. The second direction 22a is oriented substantially antiparallel to the first direction 20a.

For the reception of a part 18a of the fixing unit 12a, the mounting element 14a has at least one reception region 16a. The mounting element 14a comprises, in the present embodiment, a plurality of reception regions 16a. The reception regions 16a are arranged in a matrix-like pattern (compare FIGS. 2 and 3). In the following only one of the reception regions 16a will be described.

The reception region 16a has an insertion region 24a for the insertion of the part 18a of the fixing unit 12a. The reception region 16a has a holding region 26a for holding the part 18a of the fixing unit 12a, in a mounted state. The insertion region 24a and the holding region 26a are connected to each other.

The insertion region 24a and the holding region 26a are located next to each other with respect to a longitudinal extension direction 28a of the reception region 16a. The insertion region 24a and the holding region 26a are located next to each other in a direction 44a, which is oriented perpendicularly to the longitudinal extension direction 28a of the reception region 16a and which is oriented parallel to a main extension plane of the mounting element 14a.

The insertion region 24a is embodied as a groove. The holding region 26a is embodied as a groove.

The insertion region 24a has a greater extension in the longitudinal extension direction 28a of the reception region 16a than the holding region 26a. The insertion region 24a has a longitudinal extension 64a in the longitudinal extension direction 28a of the reception region 16a which is greater than a longitudinal extension 66a of the holding region 26a in the longitudinal extension direction 28a of the reception region 16a. In the longitudinal extension direction 28a of the reception region 16a, the insertion region 24a projects beyond the holding region 26a on both sides.

The insertion region 24a comprises at an insertion sub-region 30a. The insertion sub-region 30a has a longitudinal extension direction 32a which is orientated inclined with respect to a longitudinal extension direction 34a of the holding region 26a.

The insertion region 24a comprises at a further insertion sub-region 36a. The further insertion sub-region 36a has a longitudinal extension direction 72a which is orientated inclined with respect to the longitudinal extension direction 34a of the holding region 26a. The insertion sub-region 30a and the further insertion subregion 36a are connected to each other. The further insertion sub-region 36a is connected to the insertion sub-region 30a.

In a perpendicular view to a main extension plane of the mounting element 14a, the further insertion sub-region 36a encloses with the insertion sub-region 30a an internal angle 74a of approximately 170°, in the present embodiment. The longitudinal extension direction 32a of the insertion sub-region 30a and the longitudinal extension direction 72a of the further insertion sub-region 36a enclose, in a perpendicular view to a main extension plane of the mounting element 14a, an internal angle 74a of approximately 170°.

The reception region 16a is symmetrical with respect to a symmetry plane which is oriented perpendicularly to the longitudinal extension direction 28a of the reception region 16a. The symmetry plane, with respect to which the reception region 16a is symmetrical, passes through a center point and/or through a midpoint of the reception region 16a.

The mounting element 14a comprises at least one further reception region 38a. The mounting element 14a comprises, in the present embodiment, a plurality of further reception regions 38a. The further reception regions 38a are arranged in a matrix-like pattern (compare FIGS. 2 and 3). In the following only one of the further reception regions 38a will be described.

The further reception region 38a has a further insertion region 40a for the insertion of the part 18a of the fixing unit 12a. The further reception region 38a has a further holding region 42a for holding the part 18a of the fixing unit 12a, in a mounted state. The further insertion region 40a and the further holding region 42a are connected to each other.

The further insertion region 40a and the further holding region 42a are located next to each other with respect to a longitudinal extension direction 76a of the further reception region 38a. The further insertion region 40a and the further holding region 42a are located next to each other in a direction 44a, which is oriented perpendicularly to the longitudinal extension direction 76a of the further reception region 38a and which is oriented parallel to a main extension plane of the mounting element 14a.

The longitudinal extension direction 76a of the further reception region 38a and the longitudinal extension direction 28a of the reception region 16a are oriented substantially parallel to each other, in a perpendicular view to a main extension plane of the mounting element 14a. The further insertion region 40a is embodied as a groove. The further holding region 42a is embodied as a groove.

The further insertion region 40a has a greater extension in the longitudinal extension direction 76a of the further reception region 38a than the further holding region 42a. The further insertion region 40a has a longitudinal extension 78a in the longitudinal extension direction 76a of the further reception region 38a which is greater than a longitudinal extension 80a of the further holding region 42a in the longitudinal extension direction 76a of the further reception region 38a. In the longitudinal extension direction 76a of the further reception region 38a, the further insertion region 40a projects beyond the further holding region 42a on both sides.

The further insertion region 40a comprises an insertion sub-region 82a. The insertion sub-region 82a of the further insertion region 40a has a longitudinal extension direction 84a which is orientated inclined with respect to a longitudinal extension direction 86a of the further holding region 42a.

The further insertion region 40a comprises a further insertion sub-region 88a. The further insertion sub-region 88a of the further insertion region 40a has a longitudinal extension direction 90a which is orientated inclined with respect to the longitudinal extension direction 86a of the further holding region 42a. The insertion subregion 82a of the further insertion region 40a and the further insertion sub-region 88a of the further insertion region 40a are connected to each other.

In a perpendicular view to a main extension plane of the mounting element 14a, the further insertion sub-region 88a of the further insertion region 40a encloses with the insertion sub-region 82a of the further insertion region 40a an internal angle 92a of approximately 170°, in the present embodiment. The longitudinal extension direction 84a of the insertion sub-region 82a of the further insertion region 40a and the longitudinal extension direction 78a of the further insertion sub-region 88a of the further insertion region 40a enclose, in a perpendicular view to a main extension plane of the mounting element 14a, an internal angle 92a of approximately 170°.

The further reception region 38a is symmetrical with respect to a symmetry plane which is oriented perpendicularly to the longitudinal extension direction 76a of the further reception region 38a. The symmetry plane, with respect to which the further reception region 38a is symmetrical, passes through a center point and/or through a midpoint of the further reception region 38a.

In a perpendicular view to a main extension plane of the mounting element 14a, the insertion region 24a and the further insertion region 40a are located next to each other in a direction 44a, which is oriented perpendicularly to the longitudinal extension direction 28a of the reception region 16a and which is oriented parallel to a main extension plane of the mounting element 14a.

In a mounted state, the fixing unit 12a is fixed to the mounting element 14a (compare FIGS. 2 and 3). The fixing unit 12a partly projects through the mounting element 14a, in a mounted state. The fixing unit 12a comprises two engagement elements 46a, in the present embodiment. The engagement elements 46a are located on different sides of a basic body 48a of the fixing unit 12a with respect to a longitudinal extension direction 94a of the fixing unit 12a. In the following, only one of the engagement elements 46a will be described.

The engagement element 46a constitutes the part 18a of the fixing unit 12a. In a mounted state, the engagement element 46a is inserted into the reception region 16a. The fixing unit 12a comprises the basic body 48a. The engagement element 46a and the basic body 48a are connected to each other. The engagement element 46a is movable with respect to the basic body 48a.

The fixing unit 12a comprises a connection element 54a for connecting the engagement element 46a and the basic body 48a. The connection element 54a connects the basic body 48a and the engagement element 46a. The connection element 54a moves the engagement element 46a back into a resting position after the engagement element 46a has been moved into at least one deflection position.

The engagement element 46a comprises a longitudinal extension 50a which is greater than a longitudinal extension 52a of the holding region 26a. In a mounted state, the engagement element 46a engages behind the mounting element 14a.

The fixing unit 12a comprises two further engagement elements 96a, in the present embodiment. The further engagement elements 96a are located on different sides of the basic body 48a of the fixing unit 12a with respect to a longitudinal extension direction 94a of the fixing unit 12a. In the following, only one of the further engagement elements 96a will be described.

In a mounted state, the further engagement element 96a is inserted into a second reception region 16a which is located distanced to the reception region 16a in the longitudinal extension direction 28a of the reception region 16a.

The fixing system 10a comprises signal transmission equipment 56a (compare FIG. 3). The fixing unit 12a is mounted to the mounting element 14a in a mounted state and fixes the signal transmission equipment 56a to the mounting element 14a. In a mounted state, the signal transmission equipment 56a is fixed to the fixing unit 12a.

FIGS. 5 to 9 show a further exemplary embodiment of the invention. The following description is substantially limited to the differences between the exemplary embodiments, wherein regarding structural elements, features and functions that remain the same the description of the other exemplary embodiments, in particular the exemplary embodiment of FIGS. 1 to 4, may be referred to. For distinguishing the exemplary embodiments, the letter a of the reference numerals in the exemplary embodiment of FIGS. 1 to 4 has been substituted by the letter b in the reference numerals of the exemplary embodiments of FIGS. 5 to 9. Regarding structural elements having the same denomination, in particular regarding structural elements having the same reference numerals, principally the drawing and/or the description of the other exemplary embodiments, in particular of the exemplary embodiment of FIGS. 1 to 4, may be referred to.

FIG. 5 shows an alternative fixing system 10b, which is embodied as a signal transmission fixing system. The fixing system 10b comprises a fixing unit 12b and a mounting element 14b for holding the fixing unit 12b. The fixing unit 12b comprises two engagement elements 46b and two further engagement elements 96b. In the following, only one of the engagement elements 46b and only one of the further engagement elements 96b will be described.

In the following a method for fixing the fixing unit 12b to the mounting element 14b will be described (compare FIGS. 5 to 9). For fixing the fixing unit 12b to the mounting element 14b, the fixing unit 12b is tilted relative to the mounting element 14b. The fixing unit 12b is approached to the mounting element 14b.

In the method for fixing the fixing unit 12b to the mounting element 14b, the further engagement element 96b is inserted into an insertion region 24b of the second reception region 16b. The further engagement element 96b is transferred from the insertion region 24b of the second reception region 16b to a holding region 26b of the second reception region 16b.

The fixing unit 12b is rotated relative to the mounting element 14b, in particular around an axis defined by the further engagement element 46b, preferably by the further engagement elements 96b. The engagement element 46b is moved, in particular manually, into a deflection position. In particular, the engagement elements 46b are moved towards each other, thereby in particular narrowing down a space between the engagement elements 46b.

In the deflection position the engagement element 46b is inserted into the insertion region 24b of the reception region 16b, in particular by rotating the fixing unit 12b.

In a state, in which the fixing unit 12b is oriented substantially parallel to the mounting element 14b, a force acting on the engagement element 46b for moving the engagement element 46b into the deflection position is removed. The connection element 54b moves the engagement element 46b back into a resting position after the engagement element 46b has been moved into the deflection position (compare FIGS. 2, 3, 8 and 9). In a mounted state, the engagement element 46b engages behind the mounting element 14b.

For solving the fixing unit 12b from the mounting element 14b, the method described above has to be done the other way round.

REFERENCE NUMERALS

10 Fixing system
12 Fixing unit
14 Mounting element
16 Reception region
18 Part
20 First direction
22 Second direction
24 Insertion region
26 Holding region
28 Longitudinal extension direction
30 Insertion sub-region
32 Longitudinal extension direction
34 Longitudinal extension direction
36 Further insertion sub-region
38 Further reception region
40 Further insertion region
42 Further holding region
44 Direction
46 Engagement element 48 Basic body
50 Longitudinal extension
52 Longitudinal extension
54 Connection element
56 Signal transmission equipment
58 Telecommunication enclosure
60 Enclosure housing
62 Enclosure door
64 Longitudinal extension
66 Longitudinal extension
68 Wall
70 Angle bracket
72 Longitudinal extension direction
74 Internal angle
76 Longitudinal extension direction
78 Longitudinal extension
80 Longitudinal extension
82 Insertion sub-region
84 Longitudinal extension direction
86 Longitudinal extension direction
88 Further insertion sub-region
90 Longitudinal extension direction
92 Internal angle
94 Longitudinal extension direction
96 Further engagement element

The invention claimed is:

1. A fixing system, comprising: at least one fixing unit, at least one mounting element for holding the at least one fixing unit, the mounting element having at least one reception region for the reception of at least one part of the at least one fixing unit, the mounting element fixing the at least one fixing unit in at least one first direction and in at least one second direction being oriented at least substantially antiparallel to the first direction, the reception region having at least one insertion region for the insertion of the at least one part of the at least one fixing unit and at least one holding region for holding the at least one part of the at least one fixing unit in at least one mounted state, the insertion region having a greater extension in at least one longitudinal extension direction of the reception region than the holding region, wherein the insertion region projecting, in the longitudinal extension direction of the reception region, beyond the holding region on both sides.

2. The fixing system according to claim 1, the mounting element being embodied as a mounting plate.

3. The fixing system according to claim 1, the mounting element constituting a back wall of at least one cabinet.

4. The fixing system according to claim 1, the insertion region being embodied as a groove.

5. The fixing system according to claim 1, the insertion region and the holding region being located next to each other with respect to at least one longitudinal extension direction of the reception region.

6. The fixing system according to claim 1, the insertion region comprising at least one insertion sub-region having at least one longitudinal extension direction which is orientated inclined with respect to at least one longitudinal extension direction of the holding region.

7. The fixing system according to claim 6, the insertion region comprising at least one further insertion sub-region, which is connected to the insertion sub-region and which, in at least one perpendicular view to at least one main extension plane of the mounting element, encloses with the insertion sub-region an internal angle of at most 175°.

8. The fixing system according to claim 1, the reception region being symmetrical with respect to at least one symmetry plane which is oriented perpendicularly to at least one longitudinal extension direction of the reception region.

9. The fixing system according to claim 1, the mounting element comprising at least one further reception region which has at least one further insertion region and at least one further holding region, wherein the insertion region and the further insertion region are located next to each other in at least one direction.

10. The fixing system according to claim 1, the mounting element comprising a plurality of further reception regions which are arranged in a matrix-like pattern.

11. The fixing system according to claim 1, the fixing unit comprising at least one engagement element which constitutes the part and which is inserted into the reception region in the mounted state.

12. The fixing system according to claim 11, the fixing unit comprising at least one basic body, the engagement element being movable with respect to the basic body.

13. The fixing system according to claim 11, the engagement element comprising at least one longitudinal extension which is greater than at least one longitudinal extension of the holding region.

14. The fixing system according to claim 12, the fixing unit comprising at least one connection element which connects the basic body and the engagement element and which moves the engagement element back into at least one resting position after the engagement element has been moved into at least one deflection position.

15. The fixing system according to claim 1, further comprising signal transmission equipment, the fixing unit being mounted to the mounting element in at least one mounted state and fixing the signal transmission equipment to the mounting element.

16. Telecommunication enclosure having at least one fixing system according to claim 1.

17. A fixing system, comprising: at least one fixing unit, at least one mounting element for holding the at least one fixing unit, the mounting element having at least one reception region for the reception of at least one part of the at least one fixing unit, the mounting element fixing the at least one fixing unit in at least one first direction and in at least one second direction being oriented at least substantially antiparallel to the first direction, the reception region having at least one insertion region for the insertion of the at least one part of the at least one fixing unit and at least one holding region for holding the at least one part of the at least one fixing unit in at least one mounted state, the insertion region comprising at least one insertion sub-region having at least one longitudinal extension direction which is orientated inclined with respect to at least one longitudinal extension direction of the holding region and the insertion region comprising at least one further insertion sub-region, which is connected to the insertion sub-region and which, in at least one perpendicular view to at least one main extension plane of the mounting element, encloses with the insertion sub-region an internal angle of at most 175°.

18. Telecommunication enclosure having at least one fixing system according to claim 17.

* * * * *